(12) United States Patent
Tanaka

(10) Patent No.: US 8,937,804 B2
(45) Date of Patent: Jan. 20, 2015

(54) DISPLAY DEVICE

(71) Applicant: Japan Display East Inc., Mobara-shi, Chiba-ken (JP)

(72) Inventor: Kazuyoshi Tanaka, Mobara (JP)

(73) Assignee: Japan Display Inc., Tokyo (JP)

( * ) Notice: Subject to any disclaimer, the term of this patent is extended or adjusted under 35 U.S.C. 154(b) by 192 days.

(21) Appl. No.: 13/740,423

(22) Filed: Jan. 14, 2013

(65) Prior Publication Data

US 2013/0188301 A1   Jul. 25, 2013

(30) Foreign Application Priority Data

Jan. 25, 2012   (JP) ................................. 2012-012799

(51) Int. Cl.
  *G06F 1/16*   (2006.01)
  *H05K 5/02*   (2006.01)
  *H05K 5/00*   (2006.01)

(52) U.S. Cl.
  CPC ............ *H05K 5/0217* (2013.01); *H05K 5/0017* (2013.01)
  USPC ................................. 361/679.21; 361/679.26

(58) Field of Classification Search
  USPC .................................................... 361/679.21
  See application file for complete search history.

(56) References Cited

U.S. PATENT DOCUMENTS

| | | | | |
|---|---|---|---|---|
| 7,940,519 B2 * | 5/2011 | Liu et al. | ................... | 361/679.21 |
| 8,305,744 B2 * | 11/2012 | Shedletsky et al. | ...... | 361/679.21 |
| 8,724,297 B2 * | 5/2014 | Tho | ........................... | 361/679.01 |
| 2006/0152471 A1 | 7/2006 | Sugawara | | |
| 2007/0025072 A1 * | 2/2007 | Liao | ............................. | 361/683 |
| 2009/0002930 A1 * | 1/2009 | Nakanishi et al. | ............ | 361/681 |
| 2012/0026666 A1 * | 2/2012 | Crooijmans et al. | ...... | 361/679.26 |

FOREIGN PATENT DOCUMENTS

JP   2006-195146   7/2006

* cited by examiner

*Primary Examiner* — Anthony Q Edwards
(74) *Attorney, Agent, or Firm* — Antonelli, Terry, Stout & Kraus, LLP.

(57) ABSTRACT

A display device includes a display panel that displays an image in a display area, a frame that is configured to have an opening in a portion facing the display area of the display panel, and to cover a peripheral portion of the display area of the display panel and side surfaces of the display panel, and shock absorbers that are arranged in a portion facing the display panel around the opening of the frame. The shock absorbers include first shock absorbers, and second shock absorbers thinner than the first absorbers. With this configuration, in the display device, the display panel or a constituent component of the display panel does not interfere with the frame or the like even if the display panel or the constituent component is warped.

5 Claims, 8 Drawing Sheets

DISPLAY DEVICE

CROSS-REFERENCE TO RELATED APPLICATION

The present application claims priority from Japanese application JP2012-012799 filed on Jan. 25, 2012, the content of which is hereby incorporated by reference into this application.

BACKGROUND OF THE INVENTION

1. Field of the Invention

The present invention relates to a display device.

2. Description of the Related Art

As information communication terminals such as computers and display devices for television receivers, liquid crystal display devices have been widely used. Also, organic EL display devices (OLED) and field emission display devices (FED) have also been known as flat panel display devices. The display device of this type has a display panel fixed to a frame and is attached to a mobile terminal device or the like.

The display panel is generally formed with a glass substrate as a base material, and the frame to which the display panel is fixed is made of metal. Therefore, a member having a shock absorbing property such as an elastic rubber is arranged on a side of the frame which contacts with the display panel so that the display panel might not directly contact with the metal of the frame.

JP 2006-195146 A discloses a liquid crystal display device in which a film material is disposed to be brought into contact with the frame and the display panel to prevent incoming dust and light leakage.

SUMMARY OF THE INVENTION

As a result of conducting a continuous current test in the liquid crystal display device under a high-temperature environment, the inventors of the present invention have found that the light leakage occurs in corner portions of a display area during black display. This is conceivably because a center of an upper polarizing plate 806 of the display panel is warped in a direction of a frame 801 as illustrated in FIG. 8, and interferes with an elastic rubber arranged on a display panel side of the frame, and corners of the display panel are subject to a strong force, and warped, thereby leaking light from the corners.

The present invention has been made in view of the above circumstances, and therefore an object of the present invention is to provide a display device in which even when a display panel or a constituent component of the display panel such as a polarizing plate is warped, the display panel or the constituent component does not interfere with the shock absorbers or the like.

According to the present invention, there is provided a display device, including: a display panel that displays an image in a display area; a frame that is configured to have an opening in a portion facing the display area of the display panel, and to cover a peripheral portion of the display area of the display panel and side surfaces of the display panel; and shock absorbers that are arranged in a portion facing the display panel around the opening of the frame, in which the shock absorbers include first shock absorbers, and second shock absorbers thinner than the first shock absorbers.

Also, in the display device according to the present invention, a periphery of the opening may be shaped in a rectangle, one of the first shock absorbers and the second shock absorbers may be arranged on long sides of the rectangle, and the other may be arranged on short sides of the rectangle.

Also, in the display device according to the present invention, the first shock absorbers may be arranged on the long sides of the display panel, and the second shock absorbers may be arranged on the short sides of the display panel.

Also, in the display device according to the present invention, the shock absorbers arranged on the long sides of the rectangle may be arranged only on center portions of the long sides, and the shock absorbers arranged on the short sides of the rectangle may be arranged in the overall short sides to cover the short sides.

Also, in the display device according to the present invention, the first shock absorbers may be made of an elastic rubber, and the second shock absorbers may be made of a resin such as PET (polyethylene terephthanlate).

DETAILED DESCRIPTION OF THE INVENTION

Figure 1:
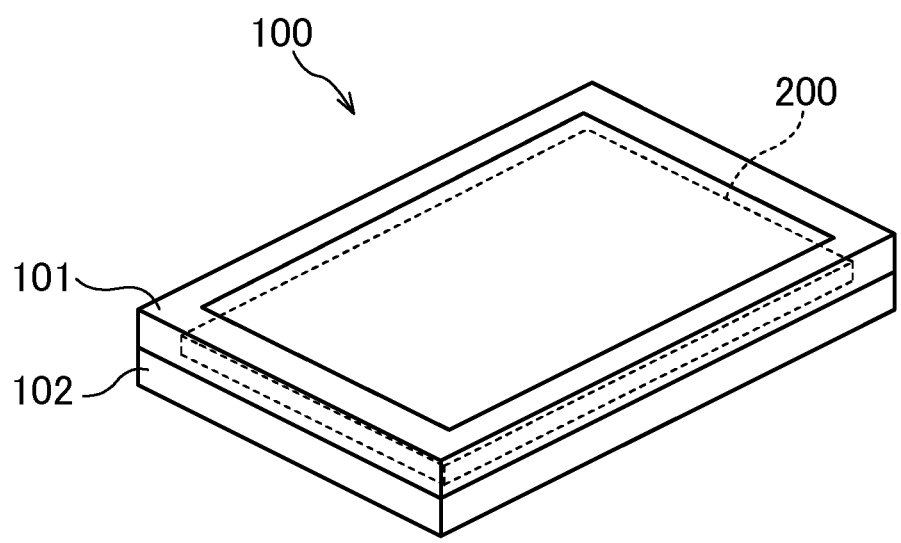
FIG. 1 is a diagram illustrating a display device according to an embodiment of the present invention.

Hereinafter, a description will be given of embodiments of the present invention with reference to the accompanying drawings. In the drawings, the same or equivalent elements are denoted by identical reference numerals, and a repetitive description will be omitted.

First Embodiment

FIG. 1 is a diagram illustrating a display device 100 according to a first embodiment of the present invention. As illustrated in FIG. 1, the display device 100 includes a display panel 200, and frames 101 and 102 fixed to sandwich the display panel 200 therebetween. In this embodiment, the display panel 200 is a liquid crystal display panel, but may be another kind of display panel.

Figure 2:
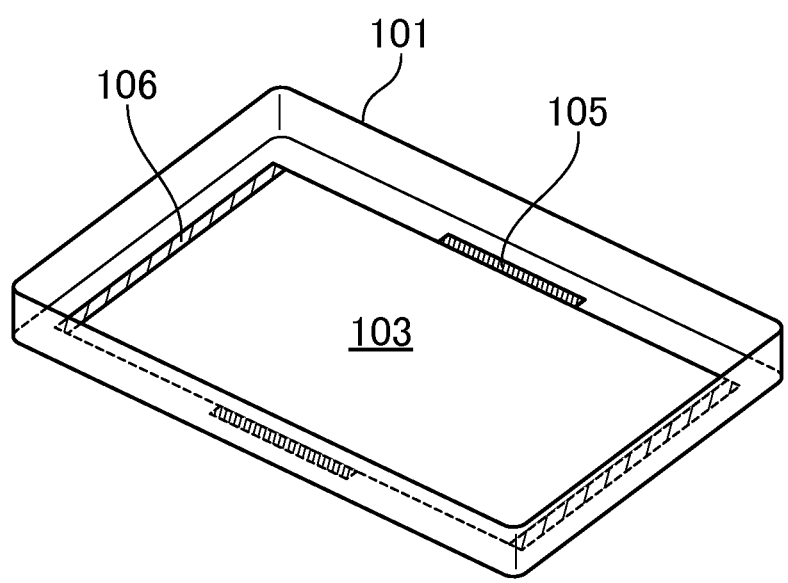
FIG. 2 is a perspective view illustrating a frame of FIG. 1 when viewing a surface onto which a display panel is fitted from obliquely above.

FIG. 2 is a perspective view illustrating the frame 101 of FIG. 1 when viewing a surface onto which the display panel 200 is fitted from obliquely above. As illustrated in FIG. 2, the frame 101 is configured to have an opening 103 in a portion facing the display area of the display panel 200, and to cover a peripheral portion of the display area of the display panel 200 and side surfaces of the display panel 200 so as to accommodate the display panel 200 as a whole.

Figure 3:
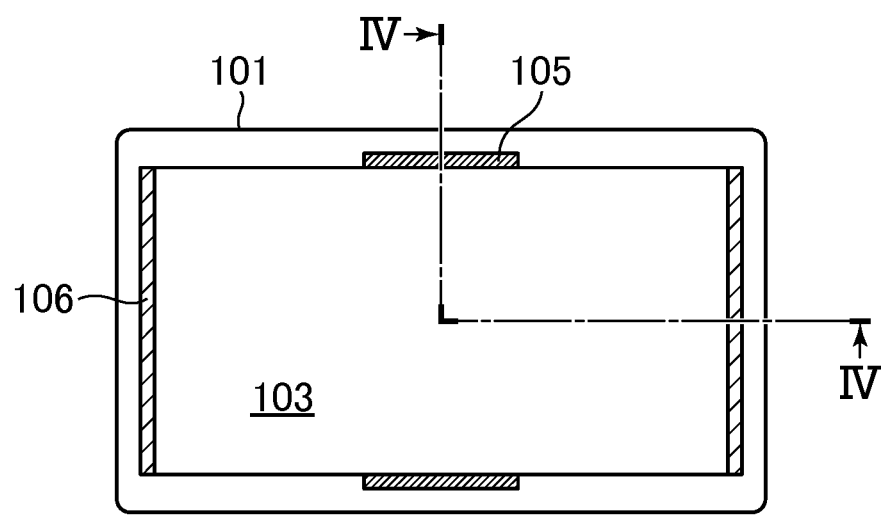
FIG. 3 is a top view illustrating the frame of FIG. 2.

FIG. 3 is a top view illustrating the frame 101 of FIG. 2. As illustrated in FIG. 3, first shock absorbers 105 made of an elastic rubber material are bonded to the centers of long sides of a rectangular portion facing the display panel 200 around the opening 103 of the frame 101, and second shock absorbers 106 made of a resin material such as PET (polyethylene terephthanlate) are bonded to entire short sides of the rectangular portion. In this example, the first shock absorbers 105 are arranged only on center portions of the long sides, and not arranged on both ends thereof. As will be described later, the first shock absorbers and the second shock absorbers are expressed by different words because those shock absorbers are different in thickness from each other. The materials of the first shock absorbers 105 and the second shock absorbers 106 may be identical with each other.

It is assumed that, in the frame 101 according to this embodiment, particularly the short sides of the optical plate like polarizing plate configuring the display panel 200 are uniformly warped. For that reason, the shock absorbers on the short sides are formed of a thin resin such as PET so that the warped short sides do not interfere with the first shock absorbers 105. Also, the second shock absorbers 106 are arranged over the entire surfaces of the short sides so that the display panel 200 comes out of direct contact with the frame 101 made of a metal. On the other hand, on the long sides, in order to ensure a clearance taking the warped ends into consideration, the elastic rubber material which is high in the shock absorbing property is used only on the center portions of the long sides.

Figure 4:
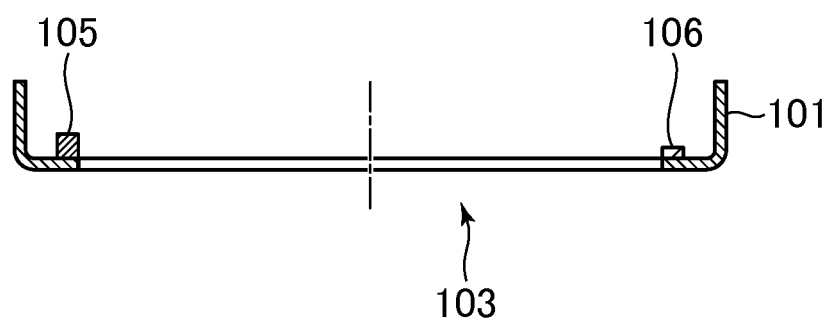
FIG. 4 is a schematically cross-sectional view taken along a line IV-IV of FIG. 3.

FIG. 4 is a schematically cross-sectional view taken along a line IV-IV of FIG. 3. As illustrated in the cross-sectional view, the thickness of the second shock absorbers 106 is thinner than that of the first shock absorbers 105. In this embodiment, the first shock absorbers are about 1.0 mm in thickness, and the second shock absorbers are about 0.5 mm in thickness. However, those first and second shock absorbers are not limited to those thicknesses.

With the above configuration, even if a light guide plate and other planar members configuring the display panel are deformed, a stress caused by contacting with the shock absorbers is not exerted on the display panel. As a result, the light leakage in the display area or the like can be suppressed. That is, even if the display panel or the constituent components of the display panel such as the polarizing plate is warped, because the display panel does not interfere with the shock absorbers, display is not affected by the warp.

Second Embodiment

Figure 5:
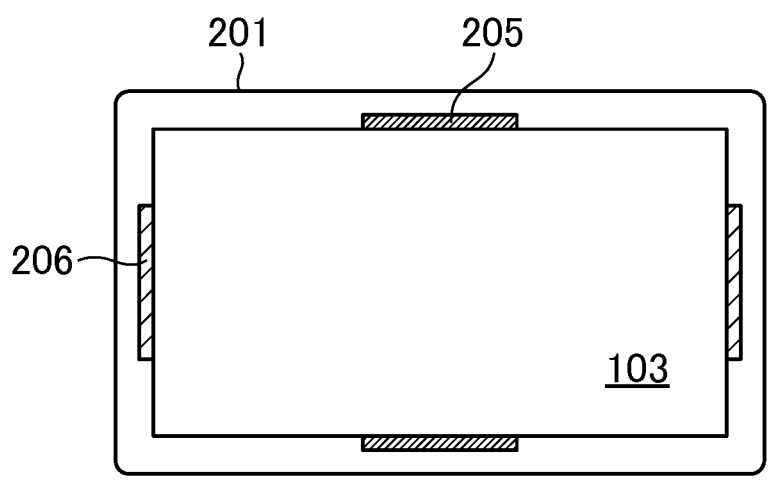
FIG. 5 is a top view illustrating a frame of a display device according to a second embodiment of the present invention.

FIG. 5 is a top view illustrating a frame 201 of a display device according to a second embodiment of the present invention. As illustrated in FIG. 5, first shock absorbers 205 according to this embodiment are arranged only on the center portions of the long sides as with the first shock absorbers 105 of the first embodiment. On the other hand, second shock absorbers 206 are arranged only on center portions of the short sides unlike the second shock absorbers 106 of the first embodiment. In this example, it is assumed that the materials and thicknesses of the first shock absorbers 205 and the second shock absorbers 206 are respectively the same as the materials and thicknesses of the first shock absorbers 105 and the second shock absorbers 106 of the first embodiment.

The first shock absorbers 205 and the second shock absorbers 206, which are fitted to the frame 201 according to this embodiment are configured assuming that, particularly, the center portions of the short sides of the planar members configuring the display panel are warped toward the frame 101 side. When the display panel assuming such warp is configured as illustrated in FIG. 5, the display panel does not interfere with the shock absorbers or the like, and therefore the display is not affected by the warp.

Third Embodiment

Figure 6:
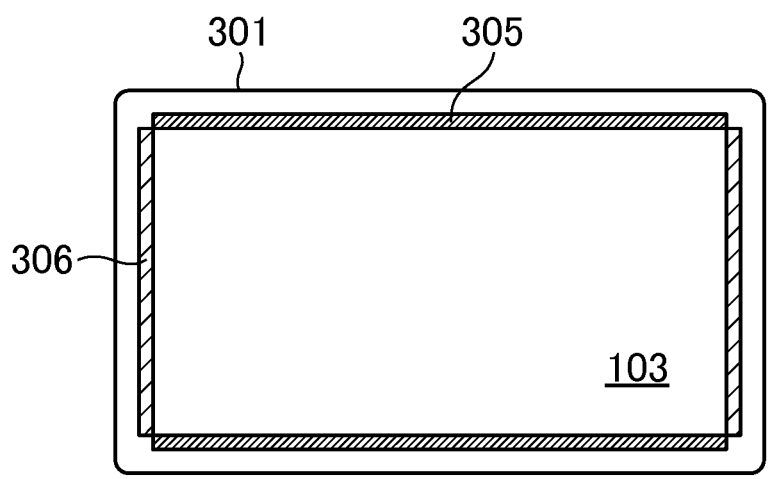
FIG. 6 is a top view illustrating a frame of a display device according to a third embodiment of the present invention.

FIG. 6 is a top view illustrating a frame 301 of a display device according to a third embodiment of the present invention. As illustrated in FIG. 6, second shock absorbers 306 according to this embodiment are arranged over the entire short sides as with the second shock absorbers 106 of the first embodiment. On the other hand, first shock absorbers 305 are arranged over the entire long sides unlike the first shock absorbers 105 of the first embodiment. In this example, it is assumed that the materials and thicknesses of the first shock absorbers 305 and the second shock absorbers 306 are respectively the same as the materials and thicknesses of the first shock absorbers 105 and the second shock absorbers 106 of the first embodiment.

The first shock absorbers 305 and the second shock absorbers 306, which are fitted to the frame 301 according to this embodiment, are configured assuming only that the short sides of the planar members configuring the display panel are warped toward the frame 101, and not particularly assuming that the long sides thereof are warped. When the display panel causing such warp is configured as illustrated in FIG. 6, the display panel does not interfere with the shock absorbers or the like, and therefore the display is not affected by the warp.

Fourth Embodiment

Figure 7:
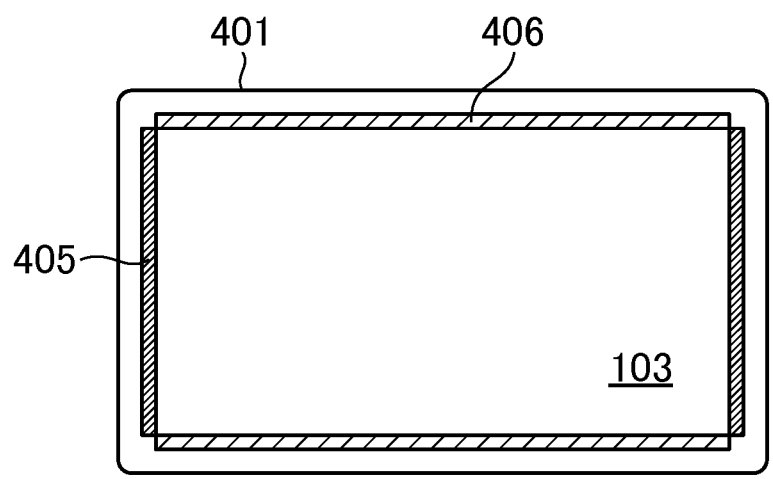
FIG. 7 is a top view illustrating a frame of a display device according to a fourth embodiment of the present invention.
Figure 8:
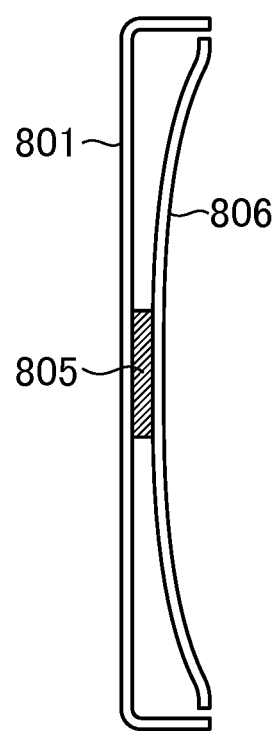
FIG. 8 is a diagram illustrating a cause of light leakage related to a problem to be solved by the invention.

FIG. 7 is a top view illustrating a frame 401 of a display device according to a fourth embodiment of the present invention. As illustrated in FIG. 7, a layout of first shock absorbers 405 and second shock absorbers 406 according to this embodiment is opposite to the layout of the first shock absorbers 305 and the second shock absorbers 306 according to the third embodiment. The first shock absorbers 405 are arranged on the short sides, and the second shock absorbers 406 are arranged on the long sides. In this example, it is assumed that the materials and thicknesses of the first shock absorbers 405 and the second shock absorbers 406 are respectively the same as the materials and thicknesses of the first shock absorbers 105 and the second shock absorbers 106 of the first embodiment.

The first shock absorbers 405 and the second shock absorbers 406, which are fitted to the frame 401 according to this embodiment, are configured assuming only that the long sides of the planar members configuring the display panel are warped toward the frame 101, and not particularly assuming that the short sides thereof are warped. When the display panel causing such warp is configured as illustrated in FIG. 7, the display panel does not interfere with the shock absorbers or the like, and therefore the display is not affected by the warp.

As has been described above, according to the above-mentioned respective embodiments, even if the display panel or the constituent components of the display panel such as the polarizing plate is warped, because the display panel does not interfere with the shock absorbers or the like, display is not affected by the warp.

In the above-mentioned embodiments, the elastic rubber material and the resin material such as PET are used for the first shock absorbers and the second shock absorbers. However, other materials may be used. Also, the first shock absorbers and the second shock absorbers are different in material from each other, but may be made of the same material.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device, comprising:
   a display panel that displays an image in a display area;
   a frame that is configured to have an opening in a portion facing the display area of the display panel, and to cover a peripheral portion of the display area of the display panel and side surfaces of the display panel; and
   shock absorbers that are arranged in a portion facing the display panel around the opening of the frame,
   wherein the shock absorbers include first shock absorbers, and second shock absorbers thinner than the first absorbers.

2. The display device according to claim 1,
   wherein a periphery of the opening is shaped in a rectangle,
   wherein one of the first shock absorbers and the second shock absorber is arranged on long sides of the rectangle, and
   wherein the other of the first shock absorbers and the second shock absorber is arranged on short sides of the rectangle.

3. The display device according to claim 2,
   wherein the first shock absorbers are arranged on the long sides of the display panel, and
   wherein the second shock absorbers are arranged on the short sides of the display panel.

4. The display device according to claim 2,
   wherein the shock absorbers arranged on the long sides of the rectangle are arranged only on center portions of the long sides, and
   wherein the shock absorbers arranged on the short sides of the rectangle are arranged in the overall short sides to cover the short sides.

5. The display device according to claim 1,
   wherein the first shock absorbers are made of an elastic rubber, and
   wherein the second shock absorbers are made of a resin.

* * * * *